(12) United States Patent
Hao et al.

(10) Patent No.: US 12,341,130 B2
(45) Date of Patent: Jun. 24, 2025

(54) METHOD OF THINNING A SEMICONDUCTOR DIE

(71) Applicant: Western Digital Technologies, Inc., San Jose, CA (US)

(72) Inventors: Meiqin Hao, Shanghai (CN); Izzie Zhang, Shanghai (CN); Elley Zhang, Shanghai (CN); Thierry Du, Shanghai (CN); Maggie Deng, Shanghai (CN); Bo Fu, Shanghai (CN); Caiden Zhong, Shanghai (CN)

(73) Assignee: Western Digital Technologies, Inc., San Jose, CA (US)

( * ) Notice: Subject to any disclaimer, the term of this patent is extended or adjusted under 35 U.S.C. 154(b) by 100 days.

(21) Appl. No.: 17/658,447

(22) Filed: Apr. 8, 2022

(65) Prior Publication Data

US 2023/0326906 A1    Oct. 12, 2023

(51) Int. Cl.
*H01L 25/065* (2023.01)
*H01L 21/304* (2006.01)
*H01L 21/463* (2006.01)
*H01L 21/48* (2006.01)
*H01L 21/56* (2006.01)
*H01L 21/683* (2006.01)
*H01L 23/00* (2006.01)

(52) U.S. Cl.
CPC ........ *H01L 25/0657* (2013.01); *H01L 21/463* (2013.01); *H01L 21/4853* (2013.01); *H01L 21/563* (2013.01); *H01L 24/11* (2013.01)

(58) Field of Classification Search
CPC ............ H01L 25/0657; H01L 21/463; H01L 21/4853; H01L 21/563; H01L 24/11; H01L 21/304; H01L 21/6836
See application file for complete search history.

(56) References Cited

U.S. PATENT DOCUMENTS

| | | | | |
|---|---|---|---|---|
| 11,404,288 B1 * | 8/2022 | Vincent | .................. | H01L 24/96 |
| 2003/0211813 A1 * | 11/2003 | Kassir | .................... | B24B 37/30 |
| | | | | 451/28 |
| 2005/0142696 A1 * | 6/2005 | Tsai | ...................... | H01L 21/563 |
| | | | | 438/114 |
| 2012/0208350 A1 * | 8/2012 | Oda | ...................... | H01L 23/293 |
| | | | | 257/E21.599 |

(Continued)

FOREIGN PATENT DOCUMENTS

WO    WO-2021200660 A1 * 10/2021    .......... H01L 21/304

*Primary Examiner* — Antonio B Crite
(74) *Attorney, Agent, or Firm* — Morgan, Lewis & Bockius LLP

(57) ABSTRACT

A method for thinning a semiconductor die includes providing the semiconductor die having electrical contacts electrically connected to and protruding from a top surface of the semiconductor die. The electrical contacts are spaced from one another on the top surface of the semiconductor die. The electrical contacts are encapsulated and a portion of the top surface of the semiconductor die is covered by a semisolid filler. The semisolid filler fills the space between the electrical contacts. An adhesive layer is applied to a top surface of the semisolid filler, and a backgrinding process is performed on a bottom surface of the semiconductor die. The method allows for thin semiconductor dies to be manufactured while reducing the risk of manufacturing defects associated with backgrinding.

10 Claims, 3 Drawing Sheets

(56) References Cited

U.S. PATENT DOCUMENTS

2017/0141046 A1* 5/2017 Jeong .................. H01L 21/6836
2017/0253776 A1* 9/2017 Kakuda .................. C08L 33/08
2019/0096840 A1* 3/2019 Ang ........................ H01L 24/24

* cited by examiner

METHOD OF THINNING A SEMICONDUCTOR DIE

BACKGROUND

The present disclosure generally relates to semiconductor devices (e.g., NAND flash devices) and assembly thereof and, more particularly, to a method of thinning a semiconductor die.

Semiconductor device packages typically include one or more integrated circuit (IC) dies (e.g., NAND dies, ASIC dies, controller dies, etc.) and/or other electronic devices that are electrically coupled to a substrate by bond wires or solder balls that convey electrical signals between the dies or devices and substrate. As demand for faster data read speeds and smaller package sizes continues to increase, the complexity of including semiconductor dies within said packages (e.g., electrically coupled to the substrate) increases as well. The dies may be coupled to the substrate using flip chip mounting, in which connections between the die and the substrate are formed using an array of solder joints. The flip chip dies often undergo a backgrinding process in which the thickness of the die is reduced such that the overall size of the semiconductor device is reduced. Prior to the backgrinding process, a backgrinding tape may be applied to the solder balls to prevent debris caused by the backgrinding process to damage the electrical connections of the semiconductor die. However, as the thickness of the die is decreased, the risk of defects occurring increases. For example, the risk of die cracking, de-taping, wafer burn out, bump deformation, and/or extra low K (ELK) cracking occurring increases as the die thickness decreases.

Therefore, there is a need to provide a method for backgrinding a semiconductor die that reduces the occurrence of defects caused by the decreasing of the die thickness.

SUMMARY

In one embodiment there is a method for backgrinding a semiconductor die, the method including providing a semiconductor die having a top planar surface, a bottom planar surface opposite the top planar surface, and a plurality of electrical contacts electrically connected to and protruding from the top planar surface, each electrical contact of the plurality of electrical contacts spaced from one another on the top planar surface of the semiconductor die. The method further includes encapsulating the plurality of electrical contacts and covering at least a portion of the top planar surface of the semiconductor die with a semisolid filler, wherein the semisolid filler fills the space between the electrical contacts. The method further includes applying an adhesive layer to a top surface of the semisolid filler, and performing a backgrinding process on the semiconductor die.

In some embodiments, the method further includes removing the adhesive layer and semisolid filler from the back-ground semiconductor die. In some embodiments, removal of the adhesive layer removes the semisolid filler from the back-ground semiconductor die. In some embodiments, an adhesion strength of the adhesive layer to the semisolid filler is greater than an adhesion strength of the semisolid filler to the plurality of electrical contacts and the top planar surface of the semiconductor die. In some embodiments, encapsulating the plurality of electrical contacts includes applying the semisolid filler to the plurality of electrical contacts and to a top planar surface of the semiconductor die, wherein the semisolid filler extends from the top planar surface of the semiconductor die, within the space between the electrical contacts, to above each electrical contact.

In some embodiments, the method further includes applying the adhesive layer to the top surface of the semisolid filler at a time after the semisolid filler has hardened to a solid state. In some embodiments, the semiconductor die has a first thickness that is the measured in a direction perpendicular to both the top planar surface and bottom planar surface, and performing the backgrinding process includes backgrinding the bottom planar surface of the semiconductor die until the semiconductor die has a second thickness that is less than the first thickness. In some embodiments, the second thickness is about 50 micrometers. In some embodiments, the semiconductor die following the backgrinding process has a total thickness variation of less than 3 micrometers. In some embodiments, the semisolid filler is a mixture including alginate.

In another embodiment there is a method for backgrinding a semiconductor die comprising a solder joint array including a plurality of solder bumps, the method including applying a semisolid filler to the plurality of solder bumps, wherein the semisolid filler encapsulates the solder bumps and fills gaps between the solder bumps, applying backgrinding tape to a top surface of the semisolid filler, and performing a backgrinding process on the semiconductor die. In some embodiments, removing the backgrinding tape and semisolid filler from the back-ground semiconductor die. In some embodiments, removal of the backgrinding tape removes the semisolid filler from the back-ground semiconductor die. In some embodiments, an adhesion strength of the backgrinding tape to the semisolid filler is greater than an adhesion strength of the semisolid filler to the plurality of solder bumps.

In some embodiments, applying the semisolid filler includes applying the semisolid filler to the plurality of solder bumps and to a top planar surface of the semiconductor die, wherein the plurality of solder bumps, the gaps between the solder bumps, and at least a portion of the top planar surface of the semiconductor die are encapsulated by the semisolid filler. In some embodiments, the method further includes applying the backgrinding tape to the top surface of the semisolid filler at a time after the semisolid filler has hardened to a solid state. In some embodiments, the semiconductor die has a top planar surface and a bottom planar surface and a first thickness that is the measured in a direction perpendicular to both the top planar surface and bottom planar surface, and performing the backgrinding process includes backgrinding the bottom planar surface of the semiconductor die until the semiconductor die has a second thickness that is less than the first thickness. In some embodiments, the second thickness is about 50 micrometers. In some embodiments, the semiconductor die following the backgrinding process has a total thickness variation of less than 3 micrometers. In some embodiments, the semisolid filler is a mixture including alginate.

BRIEF DESCRIPTION OF THE DRAWINGS

The foregoing summary, as well as the following detailed description, will be better understood when read in conjunction with the appended drawings. For the purpose of illustrating the present disclosure, there are shown in the drawings embodiments which are presently preferred, wherein like reference numerals indicate like elements throughout. It should be noted, however, that aspects of the present disclosure can be embodied in different forms and thus should not be construed as being limited to the illustrated embodiments set forth herein. The elements illustrated in the accompanying drawings are not necessarily drawn to scale, but rather, may have been exaggerated to highlight the important features of the subject matter therein. Furthermore, the drawings may have been simplified by omitting elements that are not necessarily needed for the understanding of the disclosed embodiments.

FIGS. 2A-2F are cross-sectional side views illustrating backgrinding a semiconductor device having a solder joint array in accordance with an exemplary embodiment of the present disclosure.

DETAILED DESCRIPTION

The present subject matter will now be described more fully hereinafter with reference to the accompanying Figures, in which representative embodiments are shown. The present subject matter can, however, be embodied in different forms and should not be construed as limited to the embodiments set forth herein. Rather, these embodiments are provided to describe and enable one of skill in the art.

Figure 1:
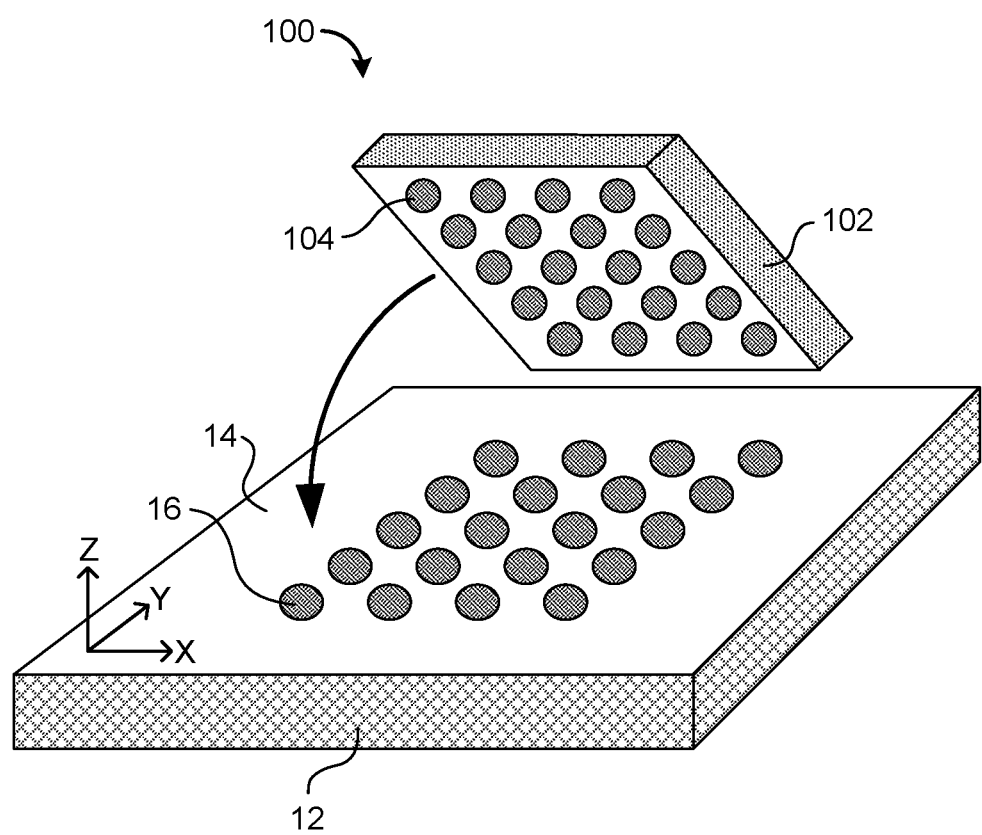
FIG. 1 is a perspective view of a semiconductor device package including a semiconductor die having a solder joint array and a substrate having corresponding bond pads.

FIG. 1 is a diagram illustrating an example semiconductor device package, generally designated 10, including a substrate 12 and a semiconductor device 100. The semiconductor device package 10 may be any type of semiconductor device package, such as, but not limited to, a system-in-package (SiP), a secure digital (SD) card, a MultiMediaCard (MMC), or a solid-state drive (SSD). The semiconductor device 100 may include a semiconductor die 102 and solder joint array including a plurality of electrical contacts 104 (e.g., solder balls, solder bumps) mounted thereon. Substrate 12 may be a printed circuit board (PCB) having electronic circuitry on a top surface 14, a bottom surface, or both. The semiconductor die 102 may be a non-volatile memory component, such as a flash memory chip (e.g., a NAND chip) for the storage of data. As illustrated in FIG. 1, the semiconductor device 100 may be positioned on the top surface 14 of substrate 12. For example, the substrate 12 may include a plurality of bond pads 16 for electrically connecting the semiconductor device 100 to substrate 12 via the plurality of electrical contacts 104. Although not shown, additional semiconductor devices may be positioned at other locations on substrate 102. In some implementations, one semiconductor die 104 may be a controller (e.g., a flash memory controller, controller die), which may be configured to manage data stored in other semiconductor dies 104 (e.g., memory chips) and to communicate with a computer or other electronic device to which semiconductor device package 10 may be connected during operation.

In some embodiments, the semiconductor die 102 may be mounted to substrate 12 using flip chip mounting, in which the die 102 is electrically connected to the circuitry of substrate 12 via the solder joint array comprising a plurality of electrical contacts 104. In this configuration, the semiconductor die 102 may be referred to as a flip chip. The electrical contacts 104 may alternatively be referred to as metal contacts 104, solder balls 104, or solder bumps 104. The electrical contacts 104 may interconnect the semiconductor die 102 to other circuitry within the semiconductor device package 10 (e.g., a controller and/or other dies connected to substrate 12). For example, the substrate 12 may include an array of contact pads 16 coupled to the top surface 14 of the substrate 12. The electrical contacts 104 may be electrically connected to the array of contact pads 16. In this manner, the electrical contacts 104 may be electrically connect the substrate 12 and semiconductor die 102. In the configuration shown in FIG. 1, in order to mount die 102 to substrate 12, the die 102 may be flipped over so that its top side faces down, and aligned so that the solder joint array aligns with the matching plurality of bond pads 16 on the substrate 12. The plurality of electrical contacts 104 may then be reheated (e.g., using a thermosonic bonding or reflow solder process) to produce an electrical connection at each electrical contact 104.

In some embodiments, the semiconductor device 100 may undergo a backgrinding process in order to reduce the thickness of the semiconductor die 102. The backgrinding process may take place prior to the semiconductor device 100 being coupled to another device (e.g., substrate 12). During backgrinding, the bottom surface of the die 102 (e.g., the surface opposite where the electrical contacts 104 are positioned) is exposed to a grinding process such that a portion of the bottom surface is shaved away. In this manner, the overall thickness of the die 102 is reduced.

Figure 2A:
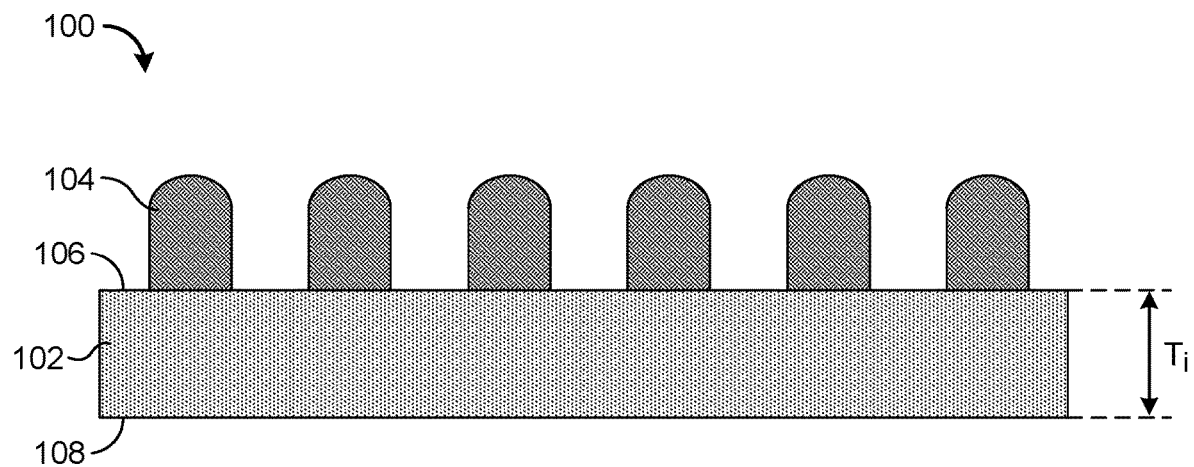

Referring to FIGS. 2A-2F, there is shown a series of cross-sectional side view diagrams depicting a method of backgrinding the semiconductor device 100 in accordance with an exemplary embodiment of the present disclosure. Referring to FIG. 2A, the semiconductor device 100 including the semiconductor die 102 and the solder joint array is shown. The solder joint array may include a plurality of electrical contacts 104. In some embodiments, the electrical contacts 104 are solder bumps. The electrical contacts 104 may be coupled to a top planar surface 106 of the semiconductor die 102. In some embodiments, there may be an electrical circuit at the top planar surface 106 of the semiconductor die 102. The electrical circuit may be partially exposed at the top planar surface 106 of the semiconductor die 102. In other embodiments, the electrical circuit is positioned below the top planar surface 106. In some embodiments, the electrical contacts 104 are electrically connected to the electrical circuit of the semiconductor die such that the electrical contacts 104 are in electrical communication with the semiconductor die 102. The semiconductor die 102 may include a bottom planar surface 108 opposite the top planar surface 106. The bottom planar surface 108 may be substantially parallel to the top planar surface 106. The semiconductor die 102 may have an initial thickness $T_i$ as measured in a direction perpendicular to the top and bottom planar surfaces 106, 108. The initial thickness $T_i$ may refer to the thickness of the semiconductor die 102 prior to the backgrinding process, which is discussed in more detail with reference to FIG. 2D.

Figure 2B:
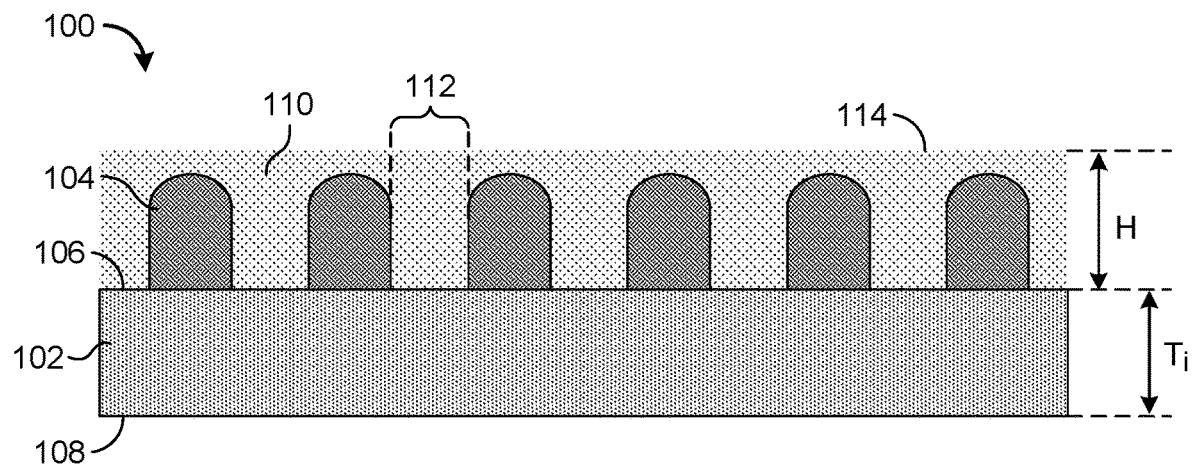

Referring to FIG. 2B, a filler 110 may be applied to the semiconductor device 100. In some embodiments, the filler 110 may be applied by a machine having a nozzle disposed above the semiconductor device 100. The semiconductor device 100 may be placed on a supporting table which rotates with respect to the nozzle while the filler 110 is applied. The machine may apply the filler 110 through the nozzle on the top planar surface 106 until the filler 110 uniformly covers the electrical contacts 104. In some embodiments, other filler application devices may be used (e.g., a squeegee) to apply the filler 110 to the top planar surface 106 of the semiconductor device 100.

The filler 110 may be in a semisolid state when applied to the semiconductor device 100. The filler 110 may be applied to the electrical contacts 104 such that the filler 110 encapsulates the plurality of electrical contacts 104. In some embodiments, the filler 110 fills the gaps 112 between the electrical contacts 104. For example, as illustrated in FIG. 2B, the electrical contacts 104 are spaced one from another such that there is a gap 112 formed between each adjacent electrical contact 104, and the gaps 112 may be substantially filled by the filler 110. Put another way, the filler 110 fills the space between the electrical contacts 104 (e.g., the gaps 112) up to the height H. Where the filler 110 fills the space above each electrical contact 104, the filler 110 extends from the periphery of the electrical contacts 104 up to the top planar surface 114. In this manner, the filler 110 may substantially encapsulate each electrical contact 104 and cover the portions of the top planar surface 106 of the semiconductor die 102 where there are gaps 112 between the electrical contacts 104.

In some embodiments, the filler 110 encapsulates the electrical contacts 104 such that a top planar surface 114 of the filler 110 is positioned above each electrical contact 104. The top planar surface 114 of the filler 110 may be at a height H from the top planar surface 106 of the semiconductor die 102. The height H of the filler 110 may be greater than the height of the electrical contacts 104. In the gaps, the filler 110 may extend upwardly from the top planar surface 106 of the semiconductor die 102 by height H. In some embodiments, applying the filler 110 includes applying a volume of the filler 110 to the semiconductor device 100. For example, the volume of the filler 110 may be calculated by multiplying the height H of the filler 110 by the length and width of the semiconductor die 102 and subtracting from that the volume of each electrical contact 104 that protrudes from the top planar surface 106 of the semiconductor die 102. In this manner, the filler 110 substantially fills a space above the top planar surface 106 of the semiconductor die 102 up to the top planar surface 114 of the filler 110. In some embodiments, the top planar surface 114 of the filler 110 is substantially parallel with the bottom planar surface 108 of the semiconductor die 102.

As mentioned above, the filler 110, when applied to semiconductor device 100, may be in a semisolid state. In some embodiments, the filler 110 is comprised of a semisolid material, compound or mixture. In some embodiments, the filler 110 may be characterized as being a viscous material, compound, or mixture. In some embodiments, the filler 110 includes alginate. In some embodiments, the filler 110 may include one or more of alginate, cementing agent(s), and/or a retarder and padding. In some embodiments, the filler 110 is a mixture including at least water and alginate. In some embodiments, the filler 110 may be a hydrocolloid impression material. In some embodiments, the filler 110 is sol formed by mixing an alginate powder with water. A sol may refer to an aggregate of very fine particles dispersed in a continuous medium (e.g., a colloid) in which the particles are solid and the dispersion medium is fluid. The filler 110 may be a gel, a gel-like substance or a paste. In some embodiments, the filler 110 may be an elastic material having an elasticity great enough to be drawn over or compressed upon the electrical contacts 104 such that the filler 110 encapsulates the electrical contacts 104.

Figure 2C:
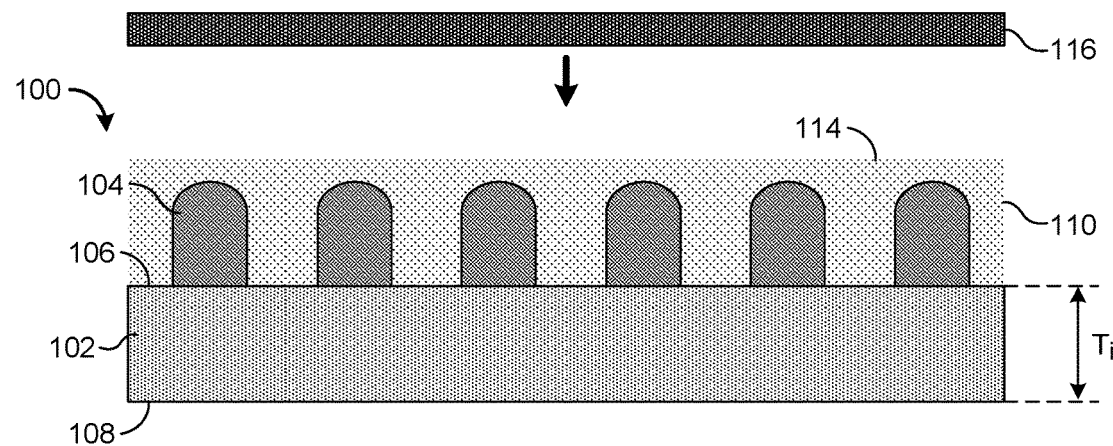

Referring to FIG. 2C, in some embodiments, an adhesive layer 116 may be applied to the filler 110 to facilitate removal of the filler 110 at a time after backgrinding the semiconductor die 102. In some embodiments, the adhesive layer 116 is a backgrinding tape. The adhesive layer 116 may be any backgrinding tape known to those skilled in the art. The adhesive layer 116 may be applied to the top planar surface 114 of the filler 110. In some embodiments, the adhesive layer 116, when applied to the top planar surface 114 of filler 110, is positioned above and spaced from the electrical contacts 104 and the top planar surface 106 of the semiconductor die 102. In this manner, the adhesive layer 116 may not be in direct contact with the electrical contacts 104 and/or the semiconductor die 102. In some embodiments, a top planar surface of the adhesive layer 116 may be substantially parallel with the bottom planar surface 108 of the semiconductor die 102.

In some embodiments, the adhesive layer 116 is applied to the top planar surface 114 of the filler 110 at a time after the filler 110 has hardened to a solid state. For example, the filler 110, as discussed above, may be a mixture including a powder (e.g., alginate powder) and water. The filler 110 may, after a predetermined amount of time, dry such that the filler 110 transitions from a semisolid state to a solid state. In the solid state, the filler 110 may substantially encapsulate the electrical contacts 104 and cover the top planar surface 106 of the semiconductor die 102 in generally the same manner as described above with reference to FIG. 2B. In this manner, when in the hardened state, the filler 110 may provide mechanical support to the semiconductor die 102 during backgrinding. In other embodiments, the adhesive layer 116 is applied to the filler 110 prior to the filler 110 transitioning to the hardened state.

In some embodiments, the adhesive strength of the adhesive layer 116 to the filler 110 is greater than the adhesive strength of the filler 110 to the semiconductor die 102 and/or the electrical contacts 104. For example, the adhesive strength of the filler 110 to the top planar surface 106 of the semiconductor die 102 and the adhesive strength of the filler 110 to the electrical contacts 104 may each be less than the adhesive strength of the adhesive layer 116 to the filler 110. In some embodiments, the adhesive strength of the filler to the top planar surface 106 of the semiconductor die 102 and the electrical contacts 104 refers to the adhesive strength of the filler 110 once the filler 110 has hardened from the semisolid state to the solid state. In some embodiments, the adhesion strength of the filler 102 to the semiconductor die 102 and electrical contacts 104 is greater when the filler 110 is in the semisolid state than when in the solid state. In some embodiments, the adhesion strength of the filler 110, in one or both of the solid and semisolid states, to the electrical contacts 104 and die 102 is less than the adhesion strength of the adhesive layer 116 to the electrical contacts 104 and die 102, were the adhesive layer 116 to cover the electrical contacts 104 and/or die 102 according to conventional methods.

Figure 2D:
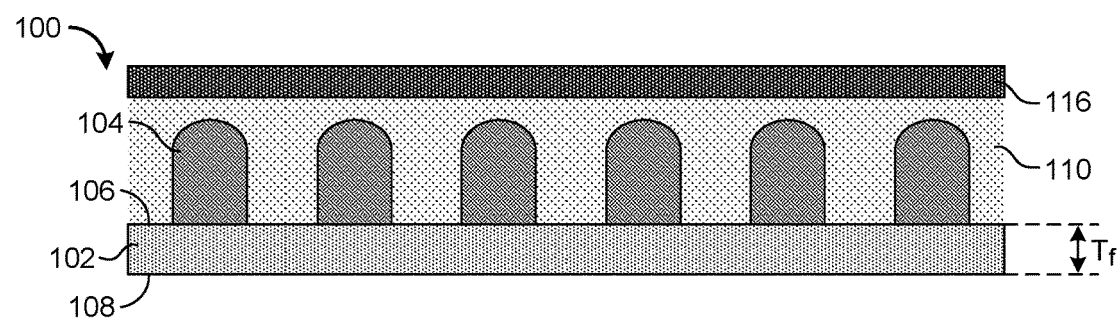

Referring to FIG. 2D, backgrinding may be performed on the semiconductor die 102. In some embodiments, backgrinding of the semiconductor die 102 occurs at a time after the filler 110 has hardened to be in the solid state and/or after the adhesive layer 116 has been applied to the filler 110. The bottom planar surface 108 of the semiconductor die 102 may be back-ground in order to reduce the thickness of the semiconductor die from the initial thickness $T_i$ to a final thickness $T_f$ that is less than the initial thickness $T_i$. During backgrinding, the semiconductor die 102 may be flipped over such that the bottom planar surface 108 faces upwards and the electrical contacts 104 face downwards. In this manner, the filler 110 and adhesive layer 116 are oriented below the bottom planar surface 108 that is oriented to be facing upward.

A grinding wheel, or any other grinding means, may be introduced in order to reduce the thickness of the semiconductor die 102. For example, a grinding wheel (not shown) may abut the bottom planar surface 108 and be actuated, or driven, in order to remove a layer of material from the bottom planar surface 108 of the semiconductor die 102. When actuated, the grinding wheel rotates relative to the semiconductor die 102 to effect removal of material from the bottom planar surface 108. The grinding wheel is actuated until a desired amount of material is removed or until a desired thickness has been achieved. This process may be repeated for different grinding wheels having different grit sizes. For example, a grinding wheel having a lower grit (e.g., a coarse grit) may be used to remove a first layer of material from the bottom planar surface 108 of the semiconductor die and a grinding wheel having a higher grit (e.g., a fine grit) may be used to remove a second layer of material.

In some backgrinding processes the semiconductor die that is being ground may be exposed to mechanical stresses and/or excess heat that may lead to damages or defects in the die. For example, the grinding wheel applies a force to the semiconductor die in order to remove material from the bottom planar surface. As the thickness of the semiconductor die is reduced, the risk of damage or defects occurring increases. For example, the semiconductor die may crack or fracture, deformation of the die may cause the electrical contacts (e.g., solder bumps) to be deformed, there may be ELK cracking of the die and/or the die may experience a die burnout issue.

The filler 110 prevents, or at least reduces the occurrence of, damages or defects, such as, for example, those as outlined in the foregoing paragraph, during backgrinding of the semiconductor die 102. In some embodiments, the filler 110 provides mechanical support to the semiconductor die 102 and/or the electrical contacts 104 during backgrinding. For example, the filler 110, in the solid state, provides a generally rigid support that encapsulates each electrical contact 104 and covers the top planar surface 106 of the semiconductor die 102. In some backgrinding processes, a backgrinding tape is applied directly to the solder bumps and may, in some areas, contact the top surface of the die. Backgrinding tape is generally softer and more pliable than the filler 110 in the solid state. In this manner, the filler 110 may provide improved mechanical support to the semiconductor die 102 during backgrinding as compared to semiconductor die backgrinding processes that do not use a filler 110.

Still referring to FIG. 2D, in some embodiments, the semiconductor die 102 may be back-ground to have a final thickness $T_f$ of less than 75 micrometers. In some embodiments, the final thickness $T_f$ is about 50 micrometers (e.g., between 45-55 micrometers). In some embodiments, the semiconductor die 102 has a total thickness variation (TTV) of less than or equal to 3 micrometers following the semiconductor die 102 being back-ground to the final thickness $T_f$.

Figure 2E:
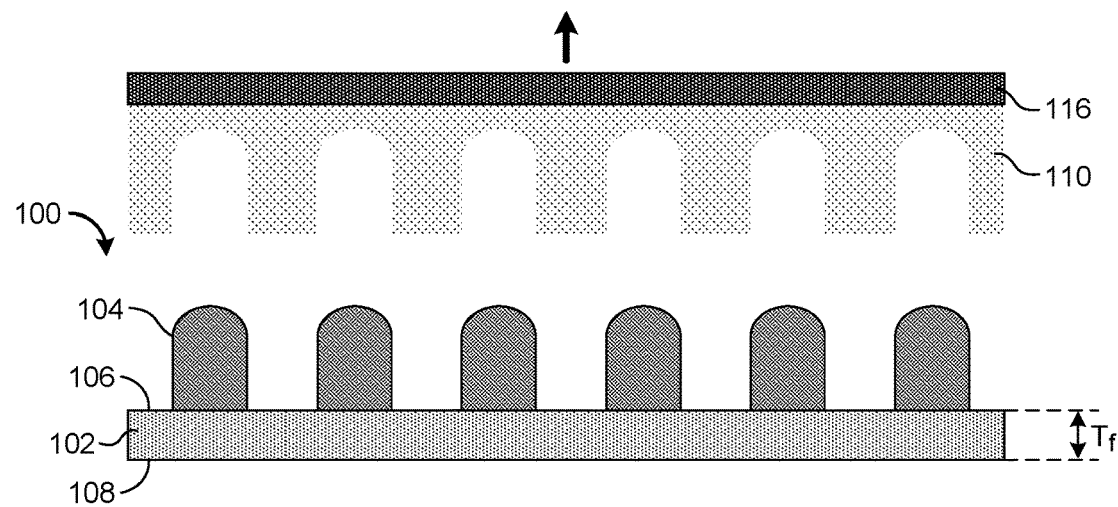

Referring to FIG. 2E, at a time following the backgrinding of the semiconductor die 102, the filler 110 and/or adhesive layer 116 may be removed. In some embodiments, removal of the adhesive layer 116 causes the filler 110 to be removed as well. For example, and as discussed above, the adhesion strength of the filler 110 to the die 102 and electrical contacts 104 may be less than the adhesion strength of the adhesive layer 116 to the filler 110. As such, the filler 110, being in a solid state, may remain adhered to the adhesive layer 116 as the adhesive layer 116 is removed. In this manner, the filler 110 and adhesive layer 116 may be easily removed from the die 102 and electrical contacts 104. In FIG. 2E, the arrow above the adhesive layer 116 illustrates that the adhesive layer 116 and filler 110 are being removed from the die 102 and electrical contacts 104. Put another way, the adhesive layer 116 and filler 110 are displaced relative to the die 102 and electrical contacts 104. However, it will be understood that the opposite may be performed. For example, in some embodiments, following backgrinding, the adhesive layer 116 may be adhered to both the hardened filler 110 (below adhesive layer 116) and to an external surface positioned opposite the filler 110 (above adhesive layer 116). As such, the adhesion of the adhesive layer 116 to both the external surface and filler 110 may allow the semiconductor die 102 and electrical contacts that are directly connected thereto to be removed from the filler 110. Put another way, following the backgrinding, the hardened filler 110 and adhesive layer 116 may remain fixed while the die 102 is displaced relative to the hardened filler 110.

In some embodiments, the filler 110 may reduce the occurrence of underfill void issues caused by residue material being present following the backgrinding process. For example, underfill may be used when connecting the semiconductor device 100 to an external device (e.g., substrate 12 in FIG. 1). The semiconductor device 100 is flipped or oriented such that the electrical contacts 104 face toward the substrate 12 and are bonded thereto via the bonding pads 16 during solder reflow. As such, there is a space between the top surface 14 of the substrate 12 and the top surface 106 of the semiconductor die 102 where the underfill material may be deposited. In some backgrinding processes, in which a backgrinding tape is applied directly to the electrical contacts, portions of the tape sometimes remain adhered to the die and solder bumps during removal of the tape. In such a scenario, during underfill, portions of the underfill cover may adhere to the residual tape rather than the die and electrical contacts, which may cause underfill voids.

Furthermore, as the density of the solder bumps is increased, the risk of residual materials (e.g., residual tape) following some backgrinding processes increases. Density here refers to the number and/or size of solder bumps within a given area on the surface of the semiconductor die. The solder bump density may be inversely related to the pitch between the solder bumps (e.g., as pitch decreases, density increases). As solder bump density increases, it becomes more difficult to cover the surface of the die that is exposed where the gaps between solder bumps are located. This often increases the risk of there being residual tape present and/or increases the amount of residual tape present following backgrinding. Therefore, as the solder bump density is increased, the risk of underfill void issues occurring increases as well.

However, the filler 110, when applied to the electrical contacts 104 and die 102, as discussed above with reference to FIG. 2B, is in a semisolid state and substantially encapsulates the electrical contacts 104 (e.g., solder bumps) and substantially fills the gaps between said electrical contacts 104. Put another way, the filler 110 more easily fills the gaps between the electrical contacts than conventional backgrinding materials. As such, the risk of there being residual filler 110 following backgrinding and removal of the die 102 from the filler 110 is reduced when compared to conventional methods. In this manner, the risk of underfill void issues is reduced by the filler 110.

It will be appreciated by those skilled in the art that changes could be made to the exemplary embodiments shown and described above without departing from the broad inventive concepts thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention and various features of the disclosed embodiments may be combined. The words "upward" and "downward" refer to directions toward and away from, respectively, the geometric center of the ball grid array having a multi-surface trace interface. Unless specifically set forth herein, the terms "a", "an" and "the" are not limited to one element but instead should be read as meaning "at least one". When specifying a numerical value or range of values, the term "about" means +/−10% unless otherwise defined.

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

Further, to the extent that the methods of the present invention do not rely on the particular order of steps set forth herein, the particular order of the steps should not be construed as limitation on the claims. Any claims directed to the methods of the present invention should not be limited to the performance of their steps in the order written, and one skilled in the art can readily appreciate that the steps may be varied and still remain within the spirit and scope of the present invention.

What is claimed is:

1. A method for thinning a semiconductor die, the method comprising:
    providing a semiconductor die having a top planar surface, a bottom planar surface opposite the top planar surface, and a plurality of electrical contacts electrically connected to and protruding from the top planar surface, each electrical contact of the plurality of electrical contacts spaced from one another on the top planar surface of the semiconductor die;
    encapsulating the plurality of electrical contacts and covering at least a portion of the top planar surface of the semiconductor die with a semisolid filler, wherein the semisolid filler fills the space between the electrical contacts and fills a space above the electrical contacts defined by a top surface of the semisolid filler, wherein the top surface of the semisolid filler has a first height from the top planar surface of the semiconductor die that is greater than a second height of the electrical contacts from the top planar surface of the semiconductor die;
    applying an adhesive layer to the top surface of the semisolid filler after the semisolid filler has hardened to a solid state, causing the adhesive layer to be in contact with the top surface of the semisolid filler at the first height;
    performing a backgrinding process on the bottom planar surface of the semiconductor die after applying the adhesive layer, wherein performing the backgrinding process includes backgrinding the bottom planar surface of the semiconductor die until the semiconductor die has a decreased thickness measured in a direction perpendicular to the bottom planar surface; and
    removing the adhesive layer from the semiconductor die after performing the backgrinding process, wherein removing the adhesive layer from the semiconductor die causes the semisolid filler to be removed from the semiconductor die.

2. The method of claim 1, wherein an adhesion strength of the adhesive layer to the semisolid filler is greater than an adhesion strength of the semisolid filler to the plurality of electrical contacts and the top planar surface of the semiconductor die.

3. The method of claim 1, wherein the decreased thickness is 45-55 micrometers.

4. The method of claim 1, wherein the semiconductor die following the backgrinding process has a total thickness variation of less than 3 micrometers.

5. The method of claim 1, wherein the semisolid filler is a mixture including alginate.

6. A method for thinning a semiconductor die comprising a solder joint array including a plurality of solder bumps, the method comprising:
    applying a semisolid filler to the plurality of solder bumps, wherein the semisolid filler encapsulates the solder bumps, fills gaps between the solder bumps, and fills a space above the solder bumps defined by a top surface of the semisolid filler, wherein the top surface of the semisolid filler has a first height from a top planar surface of the semiconductor die that is a greater than a second height of the solder bumps from the top planar surface of the semiconductor die;
    applying backgrinding tape to the top surface of the semisolid filler after the semisolid filler has hardened to a solid state, causing the backgrinding tape to be in contact with the top surface of the semisolid filler at the first height;
    performing a backgrinding process on a bottom planar surface of the semiconductor die after applying the backgrinding tape, wherein performing the backgrinding process includes backgrinding the bottom planar surface of the semiconductor die until the semiconductor die has a decreased thickness measured in a direction perpendicular to the bottom planar surface; and
    removing the backgrinding tape from the semiconductor die after performing the backgrinding process, wherein removing the backgrinding tape from the semiconductor die causes the semisolid filler to be removed from the semiconductor die.

7. The method of claim 6, wherein an adhesion strength of the backgrinding tape to the semisolid filler is greater than an adhesion strength of the semisolid filler to the plurality of solder bumps.

8. The method of claim 6, wherein the decreased thickness is 45-55 micrometers.

9. The method of claim 6, wherein the semiconductor die following the backgrinding process has a total thickness variation of less than 3 micrometers.

10. The method of claim 6, wherein the semisolid filler is a mixture including alginate.

* * * * *